US011296436B2

(12) United States Patent
He

(10) Patent No.: US 11,296,436 B2
(45) Date of Patent: Apr. 5, 2022

(54) PRESS-FIT TERMINAL WITH IMPROVED WHISKER INHIBITION

(71) Applicant: Rohm and Haas Electronic Materials LLC, Marlborough, MA (US)

(72) Inventor: Flora He, Fanling (HK)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

(21) Appl. No.: 16/871,340

(22) Filed: May 11, 2020

(65) Prior Publication Data

US 2020/0388943 A1 Dec. 10, 2020

Related U.S. Application Data

(60) Provisional application No. 62/859,496, filed on Jun. 10, 2019.

(51) Int. Cl.
*H01R 12/58* (2011.01)
*H01R 4/58* (2006.01)
*H05K 1/11* (2006.01)

(52) U.S. Cl.
CPC ............. *H01R 12/585* (2013.01); *H01R 4/58* (2013.01); *H05K 1/115* (2013.01)

(58) Field of Classification Search
CPC ................................ H01R 12/585; H01R 13/03
See application file for complete search history.

(56) References Cited

U.S. PATENT DOCUMENTS

| 3,648,355 A * | 3/1972 | Shida ..................... H01H 1/023 228/187 |
| 4,935,312 A | 6/1990 | Nakayama et al. |
| 9,728,878 B2 | 8/2017 | Shibuya et al. |
| 2005/0176267 A1* | 8/2005 | Saitoh .................. H01R 12/585 439/49 |
| 2005/0181651 A1* | 8/2005 | Matsumura .......... H01R 12/585 439/259 |
| 2009/0223830 A1 | 9/2009 | Tsujimoto et al. |
| 2009/0239398 A1 | 9/2009 | Lynch et al. |
| 2013/0196171 A1 | 8/2013 | Taninouchi et al. |
| 2015/0136456 A1* | 5/2015 | Bednarek ................ C22C 18/00 174/256 |
| 2015/0147924 A1* | 5/2015 | Shibuya .................. H01B 5/00 439/887 |

(Continued)

FOREIGN PATENT DOCUMENTS

| JP | 2010280955 A | 12/2010 |
| JP | 2020158822 A | 10/2020 |

OTHER PUBLICATIONS

Search report corresponding with Europe Application No. EP20178848 dated Sep. 22, 2020.

(Continued)

*Primary Examiner* — Chau N Nguyen
(74) *Attorney, Agent, or Firm* — John J. Piskorski

(57) ABSTRACT

A press-fit terminal for insertion into a conductive through-hole of a substrate includes an elastic deformation part with an outer and inner surface, the press-fit terminal includes, in sequence, a copper or copper alloy base, nickel or a nickel alloy barrier layer, a tin or tin alloy layer and an indium top layer. The press-fit terminal shows reduced whisker formation.

5 Claims, 3 Drawing Sheets

(56) References Cited

U.S. PATENT DOCUMENTS

2015/0171537 A1* 6/2015 Shibuya .................. H01B 1/02
361/773
2015/0310956 A1 10/2015 Schmidt

OTHER PUBLICATIONS

Search report for corresponding Taiwan Application No. 109117312 dated Oct. 14, 2020.

* cited by examiner

PRESS-FIT TERMINAL WITH IMPROVED WHISKER INHIBITION

FIELD OF THE INVENTION

The present invention is directed to a press-fit terminal with improved whisker inhibition, wherein the press-fit terminal is to be inserted into a conductive through-hole of a substrate. More specifically, the present invention is directed to a press-fit terminal with improved whisker inhibition, wherein the press-fit terminal with improved whisker inhibition is to be inserted into a conductive through-hole of a substrate, wherein the press-fit terminal includes a linear elastic deformation part with an outer and inner surface, the press-fit terminal includes, in sequence, a copper or copper alloy base, nickel or a nickel alloy barrier layer, a tin or tin alloy layer and an indium top layer.

BACKGROUND OF THE INVENTION

Tin whiskers are recognized as a much more serious reliability threat to lead-free electronic components or products due to the implementation of the European Directive on restrictions of hazardous substances (RoHS) legislation in July 2006. This position is exacerbated by the trend for increased sophistication and miniaturization in electronics.

Press-fit connection is a solderless technology for making reliable electronic joints. Modern press-fit compliant solutions provide many advantages when compared with soldering, such as solderless, low thermal stress, better reliability, lower cost, etc., making it a popular interconnect technology. It is reported that press-fit connectors have begun to dominate high-end connector applications for telecommunications, computer printed circuit boards (PCBs) and automotive electronic modules. The press-fit technology allows for the insertion of a press-fit pin or terminal into a plated-through hole (PTH) in a printed circuit board (PCB) to establish a cold-welded interconnection autonomously without using solder, especially when tin plating is used for at least one of both contact partners (pin/hole). The press-fit compliant pins having an elastic press-in zone deform when inserted into a PTH and sustain a permanent high contact normal force between the compliant pin and PTH. The high external pressure applied by the compliant press-fit zones during and after performing the press-in process significantly increases the tendency to create tin whiskers especially for pure tin finish. These whiskers grow on much shorter time scales than whiskers caused by the stress introduced by intermetallic phase growth such as $Cu_6Sn_5$ or CTE (coefficient of thermal expansion) mismatches. Furthermore, the technology trend towards higher density connector solutions (closer pin to pin/hole to hole distance and much higher external force (i.e., kilograms) further increases the risk of electrical short-circuit due to the formation of tin whiskers.

Accordingly, there is a need for a press-fit terminal having reduced whisker formation caused by external pressure or stress.

SUMMARY OF THE INVENTION

The present invention is directed to a press-fit terminal to be inserted into a conductive through-hole of a substrate, the press-fit terminal comprises: a linear elastic deformation part having an outer surface and an inner surface, the press-fit terminal includes, in sequence, a copper or copper alloy base, nickel or nickel alloy barrier layer, tin or tin alloy layer and an indium top layer. The press-fit terminal of the present invention has reduced whisker formation caused by external pressure or stress.

BRIEF DESCRIPTION OF THE INVENTION

DETAILED DESCRIPTION OF THE INVENTION

As used throughout this specification, the following abbreviations have the following meanings, unless the context clearly indicates otherwise: ° C.=degrees Centigrade; g=gram; kg=kilogram; MPa=megapascal; 1 MPa=1×10$^6$ pascals; cm=centimeters; mm=millimeters; μm=microns; μm=1×10$^{-6}$ meters; dm=decimeter; A=amperes; ASD=amperes/dm$^2$; MSA=methane sulfonic acid; In=indium; Sn=tin; Ni=nickel; Cu=copper; brass=copper-zinc alloy; ENIG=electroless nickel immersion gold; silicon nitride=Si$_3$N$_4$; sec=seconds; min=minutes; wt %=weight percent; SEM=scanning electron microscope; OSP=organic solderability preservative; and DI=deionized.

The terms "depositing", "plating" and "electroplating" are used interchangeably throughout this specification. The term "adjacent" means direct physical contact between two surfaces such that they form a common interface. The term "matte" means dull, not bright or lacking luster. The term "anneal" means to heat metal and then to cool slowly, to remove internal stresses and toughen the metal. Unless otherwise specified the solvent for plating baths is water. All numerical ranges are inclusive and combinable in any order, except where it is logical that such numerical ranges are constrained to add up to 100%.

The present invention is directed to a press-fit terminal for inserting into a conductive through-hole of a substrate, wherein the press-fit terminal includes a linear elastic deformation part with an outer and inner surface, the press-fit terminal is composed of, in sequence, a copper or copper alloy base, nickel or a nickel alloy barrier layer, a tin or tin alloy layer and an indium top layer. Whisker formation due to high external pressure, such as external pressures of 1000 MPa or greater, are inhibited.

Figure 1:
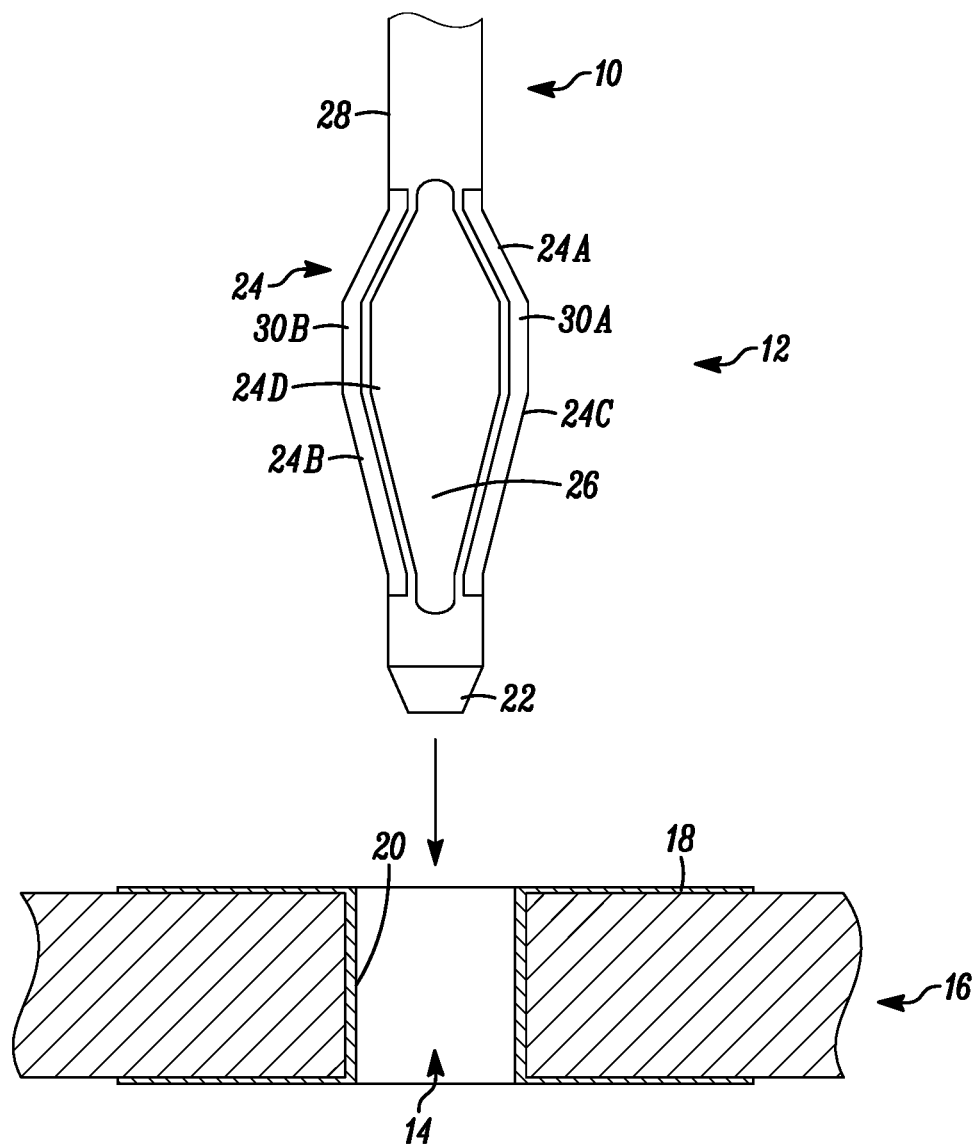
FIG. 1 illustrates a press-fit terminal and substrate with a through-hole of the present invention.

FIG. 1 illustrates a preferred embodiment of a press-fit terminal 10 of the present invention. The press-fit terminal is formed by performing press working on a metal plate of copper or copper alloy. A substrate connecting part 12 is configured to be inserted into a through-hole 14 of substrate 16, such as a printed circuit board. Numerous conductive paths 18 are formed on a surface of the substrate and a plurality of through-holes 14 are formed on the substrate 16. Such conductive paths are preferably of copper or copper alloy. On an inner surface of the through-holes 14, a contact part 20 is formed by plating or other conventional metal deposition process known in the art. The contact part 20 is joined to or continuous with the conductive paths 18. The contact part is preferably of the same metal as the conductive paths.

At one end of the substrate connecting part 12 of the press-fit terminal 10, a guide part 22 guiding the press-fit terminal to be inserted in the through-hole 14 is formed, and above the guide part 22, is a pair of elastic deformation parts 24 are formed along the length of the substrate connecting part 12, The elastic deformation parts 24, including a first elastic deformation part 24A and a second elastic deformation part 24B, are in a shape of a thick strip and expand outward to give an approximate-arc shape, and a channel part 26 is formed therein. The elastic deformation part 24 further includes an outer surface 24C and an inner surface 24D. The pair of elastic deformation parts 24 terminate and join a neck part 28 at a second end opposite to the guide part 22. When the press-fit terminal is inserted in the through-hole, the pair of elastic deformation parts are compressed toward each other, thus substantial external pressures of 1000 MPa or greater are exerted on the pair of elastic deformation parts.

In one embodiment, as shown in FIG. 1, external surfaces of the press-fit terminal slightly above the center in the longitudinal direction form approximate linear parts 30A and 30B over a length of about one third of the total length, such as to be parallel to each other and form a gentle arc. A portion corresponding to the approximate linear parts 30A and 30B acts as the press-fit connecting part and comes into electrical contact with the contact part 20 of the through-hole 14. Optionally, the contact part 20 can include a final finish top layer (not shown), such as an ENIG layer, immersion tin, immersion silver and OSP. Such final finishes are conventional and well known in the art. A commercially available ENIG process is available from Sunstone Circuits.

Figure 2:
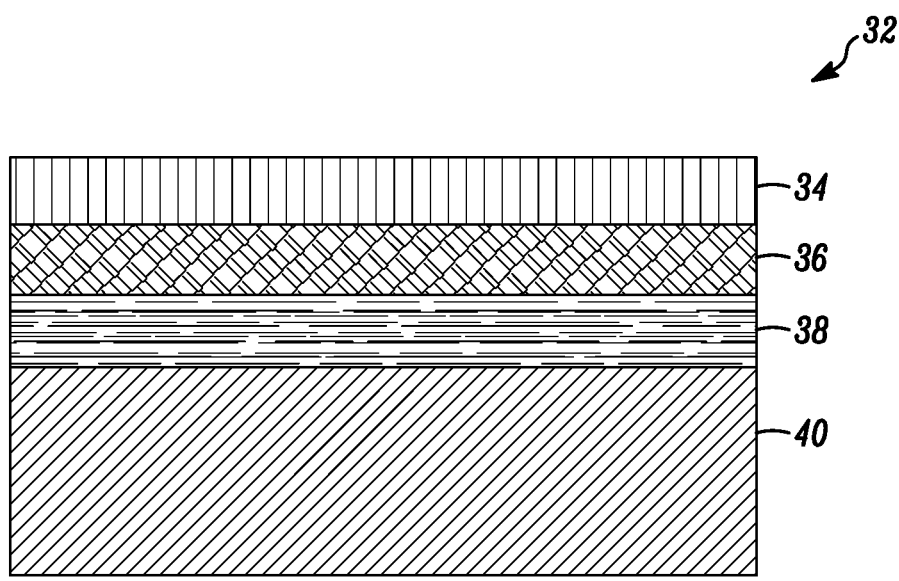
FIG. 2 illustrates a sequence of metal layers of the present invention for inhibiting whisker formation.

The entire press-fit terminal 10 is a multi-layer metal article 32 composed, in sequence, as shown in FIG. 2, of a top layer of indium metal 34, the indium metal layer 34 is adjacent to a tin or a tin alloy layer 36, the tin or tin alloy layer 36 is adjacent to a nickel or nickel alloy barrier layer 38 and the nickel or nickel alloy barrier layer 38 is adjacent to a copper or copper alloy layer 40. The copper or copper alloy layer is the base metal of which the entire press-fit terminal 10 is composed.

The thickness of each metal layer can vary. Preferably, the indium layer ranges from 0.1-3 μm, more preferably, the indium layer is from 0.2-1 μm, even more preferably, the thickness of the indium layer is from 0.2-0.5 μm, most preferably, the indium layer has a thickness of 0.2-0.4 μm. Preferably, the tin or tin alloy layer ranges from 0.5-5 μm, more preferably, the tin or tin alloy layer is 0.5-4 μm thick, most preferably, the tin or tin alloy layer is from 0.5-1 μm thick. Preferably, the nickel or nickel alloy barrier layer is from 0.5-5 μm, more preferably, from 1-4 μm thick, most preferably, from 1-2 μm thick.

The metals can be deposited using one or more conventional methods for depositing metal and metal alloys on a substrate. Such conventional methods include, but are not limited to, plating, such as electroplating, electroless plating or immersion plating, chemical vapor deposition or physical vapor deposition. Preferably, the metal and metal alloy layers are deposited by electroplating using conventional metal or metal alloy electroplating baths, including conventional parameters for electroplating the metals or metal alloys.

Preferably, when the metal layers are deposited by electroplating, the copper or copper alloy base is cleaned. Conventional metal cleaning processes can be used. Preferably, the copper or copper alloy is ultrasonically cleaned in a cleaning solution or by cathodic degreasing. Such cleaning solutions can include silicate compounds, alkali metal carbonates and compounds such as alkali metal hydroxides, glycol ethers and one or more conventional metal chelating agents. An example of a commercially available cleaning formulation is RONACLEAN™ GP-300 electrocleaning composition (available from DuPont Electronic Solutions, Wilmington, Del.). Cleaning can be done at temperatures of from 30° C. to 80° C. A copper base or press-fit terminal is preferred over a copper alloy base or press-fit terminal. When the base is copper alloy, copper-tin or copper zinc alloy is preferred.

Preferably, following the cleaning step, the copper or copper alloy base is activated with a suitable acid such as a mineral acid. Dilute concentrations of mineral acids are used. An example of such an acid is sulfuric acid, such as a dilute aqueous solution of sulfuric acid (98 wt %). However, other mineral acids can be used such a hydrochloric acid and nitric acid. The acids are used at conventional concentrations well known in the art. Activation typically is done at temperatures from room temperature to 30° C.

The metal layers are deposited on the copper or copper alloy in the same sequence regardless of the process used for depositing the metal layers. When electroplating is used to deposit the metal layers, the nickel or nickel alloy barrier layer is plated on the copper or copper alloy base such that the nickel or nickel barrier layer is electroplated directly adjacent to the copper or copper alloy. Conventional nickel or nickel alloy electroplating baths can be used to plate the nickel or nickel alloy. A preferred nickel alloy is nickel phosphorous. Nickel phosphorous plating baths are well known in the art. An example of a commercially available nickel plating bath which can be used to plate nickel on copper or copper alloy is NIKAL™ MP-200 Electrolytic Nickel bath which is a sulfate based nickel plating bath available from DuPont Electronic Solutions, Wilmington, Del. The bath provides a bright nickel deposit. Nickel electroplating can be done at a current density of 1-10 ASD, preferably, from 1-5 ASD. Nickel electroplating bath temperatures can range from 30-60° C., preferably, from 50-60° C. Nickel electroplating is done until a nickel thickness of, preferably, 0.5-5 μm is deposited on the copper or copper alloy base.

After the nickel or nickel alloy is deposited directly adjacent to the copper or copper alloy, tin or tin alloy is plated directly adjacent to the nickel or nickel alloy layer. Conventional tin or tin alloy electroplating baths can be used as well as conventional plating parameters. A preferred tin alloy is tin-bismuth, tin-indium or tin-silver. Tin-bismuth, tin-indium and tin-silver alloy plating baths are well known to those of skill in the art. An example of a commercially available pure tin electroplating bath and process is SOLDERON™ ST-200 Electrolytic Tin bath and process which is an MSA based bath available from DuPont Electronic Solutions, Wilmington, Del. The bath provides a matte tin deposit. Tin electroplating can be done at a current density of 0.5-30 ASD, preferably, from 10-30 ASD. Tin electroplating bath temperatures can range from 30-60° C., preferably, from 40-60° C. Tin electroplating on the nickel or nickel alloy layer is done until a tin or tin alloy layer, preferably, ranging from 0.5-5 μm is achieved.

Indium metal is deposited directly adjacent to the tin or tin alloy layer. The indium metal is free of any alloying metals. The indium metal layer can be electroplated from any conventional indium electroplating bath known in the art which provides an indium metal deposit, not an indium alloy deposit. A commercially available indium metal electroplating bath is INDIPALTE™ APF Electrolytic Indium bath which is an MSA based bath. The bath deposits a matte indium layer on the tin or tin alloy layer. Indium electroplating is done at a current density of 1-20 ASD, preferably, from 1-15 ASD. Indium electroplating is done until an indium layer having a thickness from 0.1-3 μm is deposited on the tin or tin alloy layer. When an indium strike layer having a thickness of 0.1-0.4 μm is plated on the tin or tin alloy layer, the current density is, preferably, from 15-20 ASD. Indium plating temperatures can range from 30-60° C., preferably from 40-55° C.

Optionally, after the metal layers are deposited on the press-fit terminal, the press-fit terminal can be annealed at temperatures from 125-160° C., preferably from 145-155° C. Preferably, the press-fit terminal metal layers are not heated or reflowed. The metal layer sequence can inhibit whisker formation without heating, annealing or reflow. It is most preferred that the metal layers of the press-fit terminal are not heated, annealed or reflowed.

Figure 3:
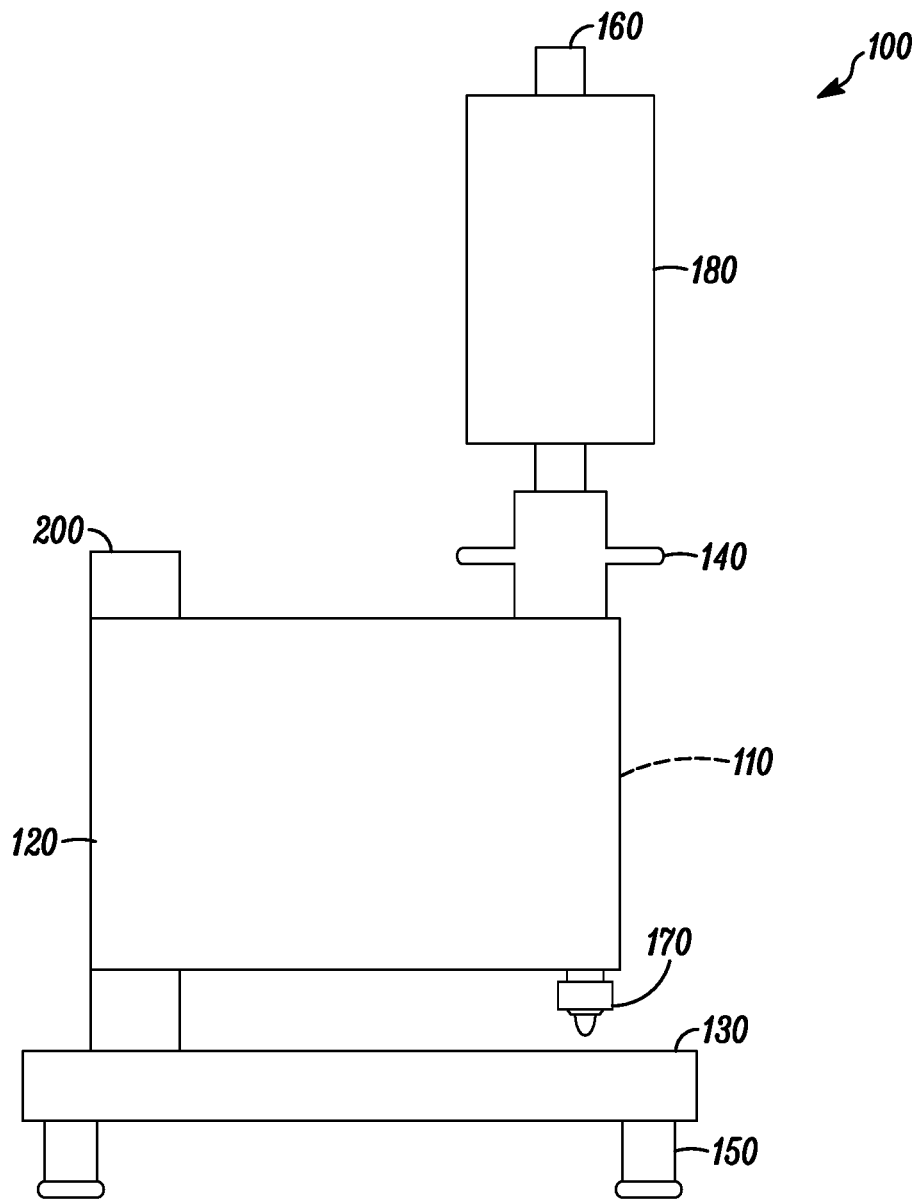
FIG. 3 is a schematic of the lateral view of the indentation tester apparatus used in whisker analysis in the Examples.

The indentation tester apparatus 100 used in the Examples below is illustrated in schematic in FIG. 3 and includes an internal shaft 110, a stainless-steel shaft holder 120, a rectangular sample stage 130, a wheel 140, four leveling feet 150 (only two of four shown), three pieces of stainless steel weights and bearings (not shown). The internal shaft 110 includes a stainless-steel rod 160 and a detachable tip 170 with a ceramic ball of silicon nitride (not shown) with diameters ranging from 0.8 mm-6.35 mm. The length of the internal shaft 110 is around 200 mm. The stain-less steel holder 120 with bearings inside is used to help keep the internal shaft vertical and minimize friction. The wheel 140 is used to load and unload the shaft with or without weights to be in contact with the surface of the sample on the rectangular sample stage 130 that is set up on a flat and vibration free table (not shown). The weight of the shaft itself is 500 g and the loading can reach 2000 g by adding additional weights on it. Four leveling feet 150 are adjusted to make sure the sample on the rectangular sample stage 130 is in a perpendicular position toward the shaft. The stainless-steel shaft holder 120 is joined to the rectangular sample stage 130 by a post 200. The preset pressure decided by the combination of weight and the size of the ceramic ball is applied on the sample for a preselected time-period. Three days have been found to be sufficient to generate whiskers.

To calibrate the apparatus the first step is to level the device and then check the basic loading (without any weight) using a small conventional electronic balance with digital display. If the basic loading is statistically very close to 500 g, no adjustment is required and it is ready for use. If the basic loading is much lower than 500 g, it means the bearings inside are tight, resulting in some resistance between the bearings and the rod. The bearings need to be slightly loosened.

Loading measurements and whisker tests are two separate steps. Loading measurements are used to check the loading before whisker tests. After the loading is confirmed to meet target loading, the samples are put on the sample stage for whisker tests. For loading measurement or whisker tests, the procedures are as follows:
1) Raise the rod by rotating the wheel counterclockwise;
2) Put the balance or sample under the rod;
3) Put the weight on the rod (for tests under loading higher than 500 g);
4) Gently rotate the wheel clockwise to apply the loading on the balance or sample (the wheel feels loose when the loading is totally applied on the balance or sample); and
5) Gently rotate the wheel counterclockwise to remove the loading and then take the balance or the sample out.

The following examples are included to further illustrate the present invention but are not intended to limit its scope.

EXAMPLES

The substrates used in the examples were of brass (Hull Cell Plates) 3 cm×3 cm. The brass plates were plated with indium, tin and nickel as shown in Tables 2-9 below. The top or outer layer was either indium or tin.

Prior to depositing the metal layers on the brass plates, the brass plates were electrocleaned using RONACLEAN™ GP-300 electrocleaning composition (available from DuPont Electronic Solutions, Wilmington, Del.). After electrocleaning, the brass plates were dipped in aqueous 10 wt % sulfuric acid at room temperature for 1-2 sec.

The metal plating baths used to deposit indium, tin and nickel on the brass plates as well as the thickness range, current density and plating temperatures are disclosed in Table 1 below.

TABLE 1

Plating Baths and Parameters

| Metal | Chemistry | Deposit Thickness (μm) | Plating Temperature (° C.) |
| --- | --- | --- | --- |
| Nickel | NIKAL ™ MP-200 Electrolytic Nickel[1] (sulfate based - bright deposit) | 1-2 at 5 ASD | 55 |
| Tin | SOLDERON ™ ST-200 Electrolytic Tin[1] (MSA based - matte deposit) | 1 at 10 ASD | 50 |
| Indium Strike | INDIPLATE ™ APF[1] Electrolytic Indium (MSA based-matte deposit) | 0.2-0.4 at 15-20 ASD | 40-55 |
| Indium | INDIPLATE ™ APF[1] Electrolytic Indium (MSA based-matte deposit) | 0.2-3 at 10 ASD | 40-55 |

[1]Available from DuPont Electronic Solutions, Wilmington, DE.

After the brass plates were plated with the metal layers, they were rinsed with DI water and dried at room temperature.

Each metal plated brass plate underwent an indentation test for whisker performance comparison. Indentation was done within a central 1 cm×1 cm area. The whisker test apparatus (described above and available from DuPont Electronic Solutions, Hong Kong) included a weight changeable vertical housing with weight variations of 500-2000 g and ceramic balls which range from 0.8-6.35 mm in diameter. The loading for the whisker testing was 2000 g with a 1 mm silicon nitride ceramic ball. The external pressure applied to the central area was around 1300 MPa. A static loading of 2000 g was applied on the plated sample for 3 days and then the loading was removed and the sample was taken out for whisker inspection around the indentation (real length of the whisker was measured) and grain morphology observation using SEM (Zeiss, Sigma 300 microscope). Two plated brass plates having a metal layer sequence of In/Sn/Ni/Brass (unheated) and Sn/In/Ni/Brass (unheated) and a second set of two plated brass plates having the same metal layer sequence was baked at 150° C. over-night then allowed to cool to room temperature.

Three days after the indentation test was done each plated metal brass plate was observed for whisker formation and further examined for indium grain morphology. Closely packed grains with uniform grain size were defined as good grain morphology. Coatings with large amounts of holes or with worm like grains and significant gaps were classified as having poor grain morphology. The results are shown for each metal layer sequence in the tables below.

TABLE 2

(Invention)

| In/Sn/Ni/Brass | In Strike Deposit 0.2-0.4 μm | In Deposit 0.25 μm | In Deposit 0.5 μm | In Deposit 1 μm |
|---|---|---|---|---|
| Whisker Performance | None Observed | None Observed | None Observed | None Observed |
| Grain Morphology | good | good | Good but some pin holes | Good but some pin holes |

TABLE 3

(Invention)

| In/Sn/Ni/Brass (Baked at 150° C. over-night) | In Strike Deposit 0.2-0.4 μm | In Deposit 0.25 μm | In Deposit 0.5 μm | In Deposit 1 μm |
|---|---|---|---|---|
| Whisker Performance | None Observed | None Observed | None Observed | None Observed |
| Grain Morphology | good | Fair | Fair | poor |

TABLE 4

(Comparative)

| In/Ni/Brass | In Strike Deposit 0.2-0.4 μm | In Deposit 0.25 μm | In Deposit 0.5 μm | In Deposit 1 μm | In Deposit 3 μm |
|---|---|---|---|---|---|
| Whisker Performance | No.: 20-50 Longest = 20 μm | No.: 20-50 Longest = 20 μm | No.: 50-80 Longest = 20 μm | No.: 20-50 Longest = 20 μm | None observed |
| Grain Morphology | poor | poor | poor | poor | poor |

TABLE 5

(Comparative)

| Sn/In/Ni/Brass | In Strike Deposit 0.2-0.4 μm | In Deposit 0.25 μm | In Deposit 0.5 μm | In Deposit 1 μm |
|---|---|---|---|---|
| Whisker Performance | No.: 50-80 Longest = 20 μm | No.: 20-50 Longest = 20 μm | No.: 20-50 Longest = 20 μm | None observed |
| Grain Morphology | good | good | good | good |

TABLE 6

(Comparative)

| Sn/In/Ni/Brass (Baked at 150° C. over-night) | In Strike Deposit 0.2-0.4 μm | In Deposit 0.25 μm | In Deposit 0.5 μm | In Deposit 1 μm |
|---|---|---|---|---|
| Whisker Performance | No.: 20-50 Longest = 40 μm | No.: 50-80 Longest = 69 μm | No.: 50-80 Longest = 43 μm | No.: 10-20 Longest = 20 μm |
| Grain Morphology | poor | poor | poor | poor |

TABLE 7

(Comparative)

| In/Brass | In Strike Deposit 0.2-0.4 μm | In Deposit 0.25 μm | In Deposit 0.5 μm | In Deposit 1 μm | In Deposit 3 μm |
|---|---|---|---|---|---|
| Whisker Performance | None observed | None observed | No.: 20-50 Longest = 20 μm | No.: 10-20 Longest = 20 μm | None observed |
| Grain Morphology | poor | poor | poor | poor | poor |

TABLE 8

(Comparative)

| Sn/In//Brass | In Strike Deposit 0.2-0.4 μm | In Deposit 0.25 μm | In Deposit 0.5 μm | In Deposit 1 μm |
|---|---|---|---|---|
| Whisker Performance | No.: 50-80 Longest = 50 μm | No.: 50-80 Longest = 50 μm | No.: 20-50 Longest = 10 μm | No.: 10-20 Longest = 10 μm |
| Grain Morphology | good | good | good | good |

TABLE 9

(Comparative)

| In/Sn//Brass | In Strike Deposit 0.2-0.4 μm | In Deposit 0.25 μm | In Deposit 0.5 μm | In Deposit 1 μm |
|---|---|---|---|---|
| Whisker Performance | No.: 10-20 Longest = 50 μm | No.: 10-20 Longest = 20 μm | None observed | None observed |
| Grain Morphology | good | good | good | poor |

The best results were achieved by the metal layer sequence of Table 2 where the indium was the top layer adjacent to a tin layer which was adjacent to a nickel barrier layer which was adjacent to the brass plate copper alloy. No whisker formation was observed and except for some observable pin holes where the indium deposit had a thickness of 0.5 μm and 1 μm the grain morphology of the indium was good. Baking the metal layer sequence of In/Sn/Ni/Brass hindered whisker inhibition but there was significant change in the grain morphology due to alloy formation.

What is claimed is:

1. A press-fit terminal to be inserted into a conductive through-hole of a printed circuit board, the press-fit terminal comprises: a first and a second elastic deformation part, the first and second elastic deformation parts are along the length of the press-fit terminal, the first and the second elastic deformation parts have an outer surface and an inner surface, the first and second elastic deformation parts are joined at one end by a guide part and at an end opposite to the guide part by a neck part, and a channel part is formed between the first and second elastic deformation parts, the press-fit terminal comprises, in sequence, a copper or copper alloy base, a nickel or a nickel alloy barrier layer adjacent to the copper or copper alloy base, a tin or tin alloy layer adjacent the nickel or the nickel alloy barrier layer, wherein the tin alloy is selected from the group consisting of tin-bismuth and tin-indium, and an indium layer adjacent to the tin or tin alloy layer.

2. The press-fit terminal to be inserted into a conductive through-hole of a printed circuit board of claim 1, wherein the nickel or nickel alloy layer has a thickness of 0.5-5 μm.

3. The press-fit terminal to be inserted into a conductive through-hole of a printed circuit board of claim 1, wherein the tin or tin alloy layer has a thickness of 0.5-5 μm.

4. The press-fit terminal to be inserted into a conductive through-hole of a printed circuit board of claim 1, wherein the indium layer has a thickness of 0.1-3 μm.

5. The press-fit terminal to be inserted into a conductive through-hole of a printed circuit board of claim 4, wherein the indium layer has a thickness of 0.1-0.4 μm.

\* \* \* \* \*